(12) United States Patent
Fujita et al.

(10) Patent No.: US 6,258,685 B1
(45) Date of Patent: Jul. 10, 2001

(54) METHOD OF MANUFACTURING HETERO-JUNCTION BIPOLAR TRANSISTOR

(75) Inventors: Koichiro Fujita, Nara; Naoki Takahashi, Kyoto, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/376,299

(22) Filed: Aug. 18, 1999

(30) Foreign Application Priority Data

Aug. 19, 1998 (JP) .................................................. 10-232948

(51) Int. Cl.$^7$ .................... H01L 21/331; H01L 21/8222; H01L 31/0328
(52) U.S. Cl. .................. 438/312; 438/309; 438/343; 438/350; 257/197
(58) Field of Search .................................... 438/312, 343, 438/350, 47, 172, 191, 235, 309, 313; 257/183, 197

(56) References Cited

U.S. PATENT DOCUMENTS

| | | | |
|---|---|---|---|
| 5,407,842 | * | 4/1995 | Morris et al. ........................... 437/31 |
| 5,429,957 | * | 7/1995 | Matsuno et al. ....................... 437/31 |
| 5,468,658 | * | 11/1995 | Bayraktaroglu ....................... 437/31 |
| 5,744,375 | * | 4/1998 | Kao et al. ............................. 437/133 |

FOREIGN PATENT DOCUMENTS

| | | |
|---|---|---|
| 4160098 | 6/1992 | (JP) . |
| 5152219 | 6/1993 | (JP) . |
| 8279464 | 10/1996 | (JP) . |
| 9-17737 | 1/1997 | (JP) . |
| 9-50963 | 2/1997 | (JP) . |
| 9205101 | 8/1997 | (JP) . |

OTHER PUBLICATIONS

Hartmann et al., "Effects of annealing on the performance of InP/InGaAs HBTs grown by LP–MOCVD", Indiumn Phosphine and Related Materials, 1997., International Conference, pp. 505–508. May 1997.*

* cited by examiner

Primary Examiner—Matthew Smith
Assistant Examiner—Lex Malsawma
(74) Attorney, Agent, or Firm—Birch, Stewart, Kolasch & Birch, LLP

(57) ABSTRACT

A method of manufacturing a hetero-junction bipolar transistor including a carbon-doped base layer includes the steps of (a) growing a base layer on an underlying layer through chemical vapor deposition, (b) forming at least one semiconductor layer over the base layer, and (c) then subjecting the base layer to thermal annealing at a temperature of 520° C. to 650° C.

21 Claims, 9 Drawing Sheets

METHOD OF MANUFACTURING HETERO-JUNCTION BIPOLAR TRANSISTOR

BACKGROUND OF THE INVENTION

1. Field of the Invention

The present invention relates to hetero-junction bipolar transistors (HBTs) manufactured by a metal-organic chemical vapor deposition (MOCVD) method and in particular to a method of manufacturing the same capable of improving properties of the HBTs.

2. Description of the Background Art

An HBT comprised of a collector of n-type GaAs, a base of p-type GaAs and an emitter of n-type AlGaAs has been increasingly studied and developed to be used as an ultra high speed electronic device.

An HBT used as a high current transistor for mobile communication is required to have a base layer having a hole carrier concentration of at least $2 \times 10^{19}/cm^3$. Furthermore, an HBT used in milliwave communication in the future is required to have a still higher hole carrier concentration of at least $4 \times 10^{19}/cm^3$. To obtain such high hole carrier concentrations, carbon has been noted as impurity atoms of the base layers. A main reason therefor is that carbon characteristically has a small diffusion constant in a crystal of a base layer and is also capable of heavy doping.

For example, Japanese Patent Laying-Open No. 9-50963 discloses that an MOCVD method using trimethyl (TM) Ga for a precursor for a group-III element, $AsH_3$ for a precursor for a group-V element and $CBr_4$ for a precursor for carbon is employed to grow a carbon-doped GaAs layer, which has achieved a hole carrier concentration of approximately $4 \times 10^{19}/cm^3$.

FIG. 8 schematically shows a cross section of a semiconductor wafer for an HBT prepared by the inventors of the present application according to a conventional technique. It should be noted that in the figures, the same reference characters denote corresponding portions. The FIG. 8 semiconductor wafer includes a substantially insulated GaAs substrate 1 on which an n-type GaAs collector contact layer 2 of 0.5 μm thickness with an electron carrier concentration of $5 \times 10^{13}/cm^3$, an n-type GaAs collector layer 3 of 0.7 μm thickness with an electron carrier concentration of $2 \times 10^{16}/cm^3$, a carbon-doped, p-type GaAs base layer 4 of 0.1 μm thickness with a hole carrier concentration of $2 \times 10^{19}/cm^3$, an n-type $Al_{0.3}Ga_{0.7}As$ emitter layer 5 of 0.1 μm thickness with an electron carrier concentration of $5 \times 10^{17}/cm^3$, and an n-type GaAs emitter contact layer 6 of 0.2 μm thickness with an electron carrier concentration of $5 \times 10^{18}/cm^3$ are successively, epitaxially grown using an MOCVD method.

In growing p-type GaAs base layer 4, at a temperature of 590° C. the flow-rate ratio of TMAs for a precursor for a group-V element to TMGa for a precursor for a group-III element, i.e., V/III was set at 3.5 and the flow rate of TMGa was set at 1.5 sccm. The n-type $Al_{0.3}Ga_{0.7}As$ emitter layer 5 and n-type GaAs emitter contact layer 6 were also grown at the temperature of 590° C.

The FIG. 8 semiconductor wafer thus obtained according to a conventional technique was used to fabricate an HBT and measure it for current gain. As a result, it has been found that the HBT's current gain varies depending on the current flow, thermal stress and the like in the HBT. It had a current-gain variation ratio of 1.8, assuming that a current-gain variation ratio is defined as a current gain of an HBT after sufficient current flow that is divided by an initial current gain of the HBT.

According to a result of an experiment carried out by the inventors of the present application, operating a circuit as designed, including a high current transistor for mobile communication, requires a current-gain variation ratio of no more than 1.1, more preferably no more than 1.05. In other words, a circuit which includes an HBT used as a high current transistor for mobile communication will not operate as designed if the HBT is fabricated using the FIG. 8 semiconductor wafer obtained according to a conventional technique.

SUMMARY OF THE INVENTION

In view of such conventional techniques as described above, an object of the present invention is to provide a method of manufacturing an HBT having improved properties and capable of being used as a power amplifier for mobile communication.

In accordance with the present invention, a method of manufacturing an HBT including a carbon-doped base layer includes the steps of (a) growing the base layer on an underlying layer through chemical vapor deposition, (b) forming at least one semiconductor layer on the base layer, and (c) then subjecting the base layer to thermal annealing at a temperature in a range of 520° C. to 650° C.

Such manufacturing method of the present invention can provide an HBT with small current-gain variation ratio. A reason therefor may be considered as follows:

For example, if carbon is used as impurity atoms for a p-type GaAs base layer included in an HBT, carbon is required to occupy a lattice site of As as a group-V atom. Accordingly, the p-type GaAs base layer grows under an MOCVD condition with less As, i.e., with a smaller V/III ratio than an n-type GaAs layer and a non-doped GaAs layer do.

The base layer grown under an MOCVD condition with such reduced V/III ratio is considered to have more As vacancies than the n-type GaAs layer and the non-doped GaAs layer have. When the As vacancies act as electron traps, the HBT's base current increases and its current gain decreases. This phenomenon similarly occurs when AlGaAs, InGaAs or the like is used for the base layer. The reason of the current-gain variation depending on the current flow, thermal stress and the like in an HBT may be because the electron occupation ratio of the energy level of As vacancies varies depending on current flow, thermal stress and the like so that the As vacancies act as electron traps at some of the time and fail to act as electron traps at other times.

According to the manufacturing method of the present invention described above, a semiconductor wafer for an HBT that is subjected to thermal annealing in an appropriate temperature range may result in less As vacancies in the base layer and hence smaller variation in current gain.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 8:
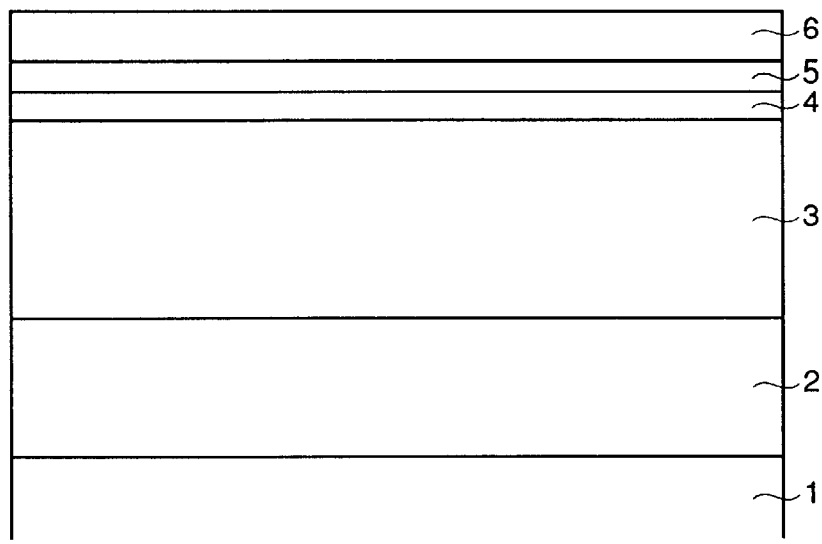
FIG. 8 is a schematic cross section of a layered structure of a semiconductor wafer usable for fabricating an HBT in the first embodiment.

In a first embodiment of the present invention, the aforementioned FIG. 8 semiconductor wafers were initially prepared according to a conventional technique. The FIG. 8 semiconductor wafers were subjected to thermal annealing in ambient nitrogen for 1 to 90 minutes at 500° C., 520° C., 550° C., 600° C., 650° C. and 670° C. It should be noted that in the present specification, the thermal annealing is applied at a heating rate of 5° C./second and a cooling rate of 0.5° C./second, unless particularly mentioned. Semiconductor wafers subjected to such thermal annealing were used to fabricate HBTs. On the FIGS. 1 and 2 graphs are plotted measurements of initial current gain and current-gain variation ratio for each of the HBTs.

Figure 1:
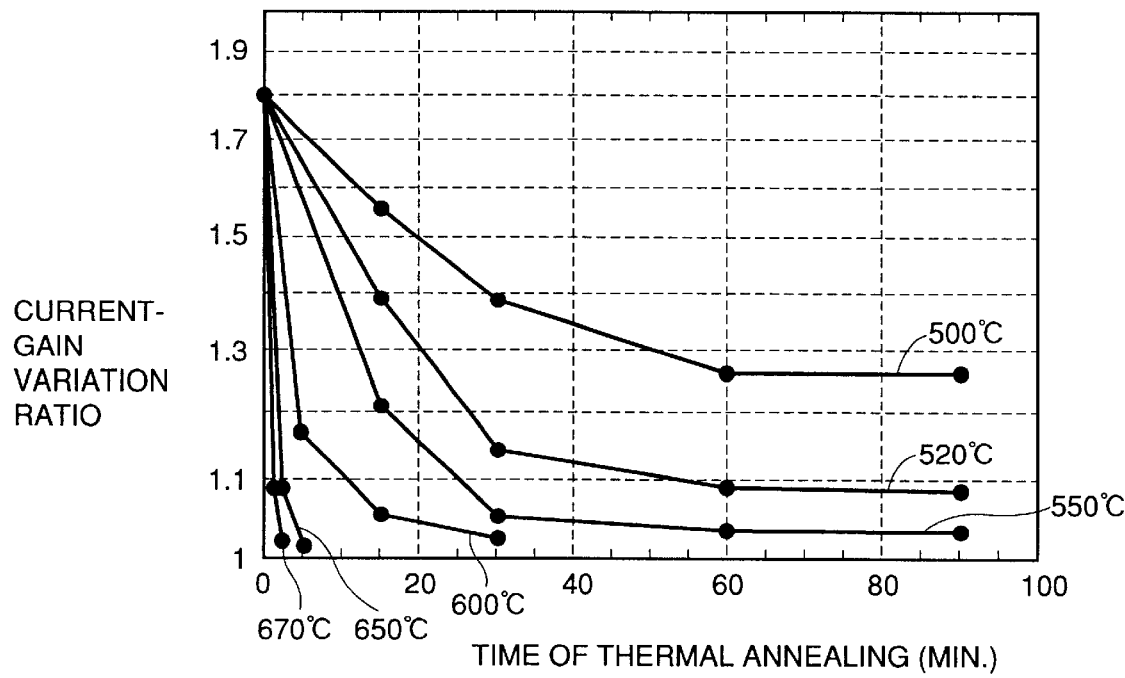
FIG. 1 is a graph of HBT current-gain variation ratio versus time of thermal annealing with varied temperature in a first embodiment of the present invention.

In the FIG. 1 graph, the horizontal axis represents time of thermal annealing applied to a wafer (in minutes) and the vertical axis represents HBT current-gain variation ratio, and the curves correspond to their respective temperatures of thermal annealing. In the FIG. 2 graph, the horizontal axis represents time of thermal annealing applied to a wafer and the vertical axis represents initial HBT current gain, and the curves correspond to their respective temperatures of thermal annealing.

As is apparent from FIG. 1, to obtain an HBT with a current-gain variation ratio of no more than 1.1, thermal annealing must be applied at a temperature of at least 520° C. Also, as is apparent from FIG. 2, to obtain improved initial HBT current gain, a wafer should be subjected to thermal annealing at a temperature of no more than 650° C.

Figure 2:
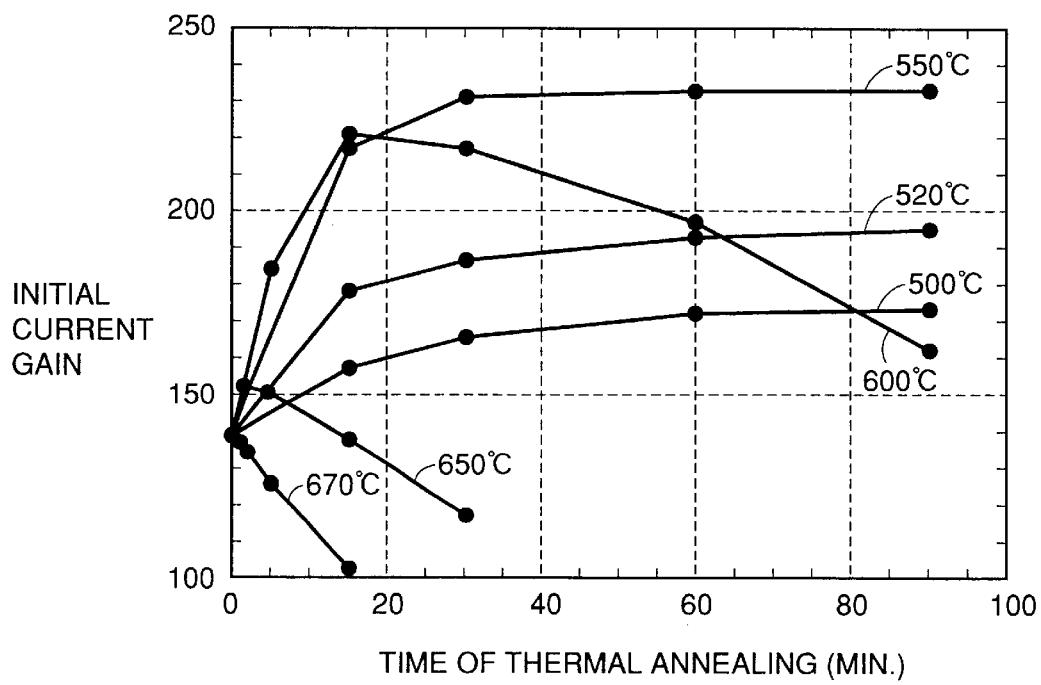
FIG. 2 is a graph of initial HBT current gain versus time of thermal annealing with varied temperature in the first embodiment.

Furthermore, as is apparent from FIGS. 1 and 2, to obtain the HBT current-gain variation ratio of no more than 1.1 and improved initial HBT current gain, thermal annealing must be applied at least two minutes and then thermal annealing for more than 60 minutes hardly contributes to further improvement in the HBT properties. Further examination of the FIGS. 1 and 2 graphs also reveals that to obtain an HBT with a current-gain variation ratio of no more than 1.05 and large initial current gain, a wafer should be subjected to thermal annealing most preferably in a range of 550° C. to 600° C.

It should be noted that a wafer subjected to thermal annealing in an atmosphere of inert gas, hydrogen or vacuum can be as effective as that subjected to thermal annealing in an atmosphere of nitrogen in accordance with the first embodiment. It should also be noted that using AlGaAs or InGaAs for a base layer can be as effective as using GaAs for a base layer in accordance with the first embodiment.

Reference Example

In this example, a method analogous to that according to the aforementioned conventional technique was employed to prepare a semiconductor wafer having the layered structure shown in FIG. 8. More specifically, the manufacturing method of this example differs from the conventional manufacturing method only in that base layer 4 was subjected to thermal annealing in the MOCVD reactor before emitter layer 5 was deposited. Base layer 4 was subjected to thermal annealing at 600° C. for 15 minutes.

A wafer thus obtained was used to fabricate an HBT for this example. The HBT had an initial current gain of 85 and a current-gain variation ratio of 1.8. In other words, the thermal annealing of this example not only failed in reduction of HBT current-gain variation ratio but also has significantly reduced initial HBT current gain.

In this example the failure in reduction of current-gain variation ratio may be because arsenic is desorbed from a surface of base layer 4 so that As vacancies cannot be reduced. Furthermore, the significant reduction in current gain may be because arsenic is desorbed from a surface of base layer 4 so that an interface of base 4 and emitter 5 is degraded in its properties.

Second Embodiment

Figure 3:
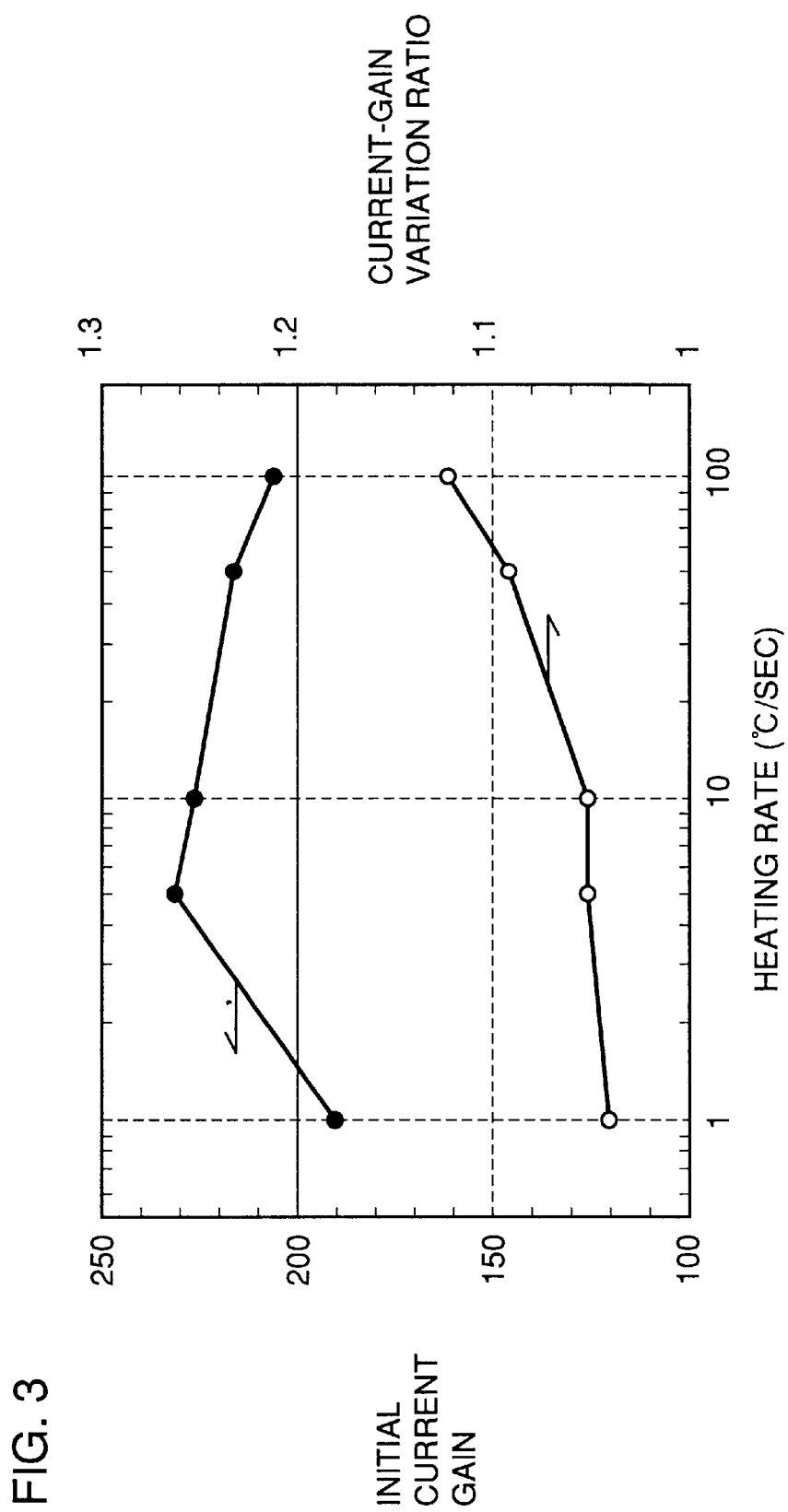
FIG. 3 is a graph of initial HBT current gain and HBT current-gain variation ratio versus heating rate of thermal annealing in a second embodiment of the present invention.

In a second embodiment was examined how various heating rates for thermal annealing affect initial HBT current gain and HBT current-gain variation ratio. More specifically, the FIG. 8 wafers prepared according to the conventional example were heated at different heating rates to 550° C. and then subjected to thermal annealing at the temperature for 30 minutes. The heating rates applied were 1° C./sec, 5° C./sec, 10° C./sec, 50° C./sec and 100° C./sec. The wafers thus treated were then used to fabricate HBTs. FIG. 3 represents initial current gain and current-gain variation ratio in the HBTs.

In FIG. 3, the horizontal axis represents heating rate of thermal annealing (in ° C./sec), and the left vertical axis represents initial HBT current gain and the right vertical axis represents HBT current-gain variation ratio. In this graph, as represented with white dots, current-gain variation ratio decreases as heating rate is reduced in a range from 100° C./sec to 1° C./sec, and current-gain variation ratio is preferably no more than 1.1 for a heating-rate range of 1° C./sec to 50° C./sec. Furthermore, current-gain variation ratio is reduced more preferably to no more than 1.05 in a heating-rate range of 1° C./sec to 10° C./sec. It can also be understood that, as represented in the FIG. 3 graph with black dots, initial current gain is most preferably increased in a heating-rate range of 5° C./sec to 10° C./sec.

Third Embodiment

Figure 4:
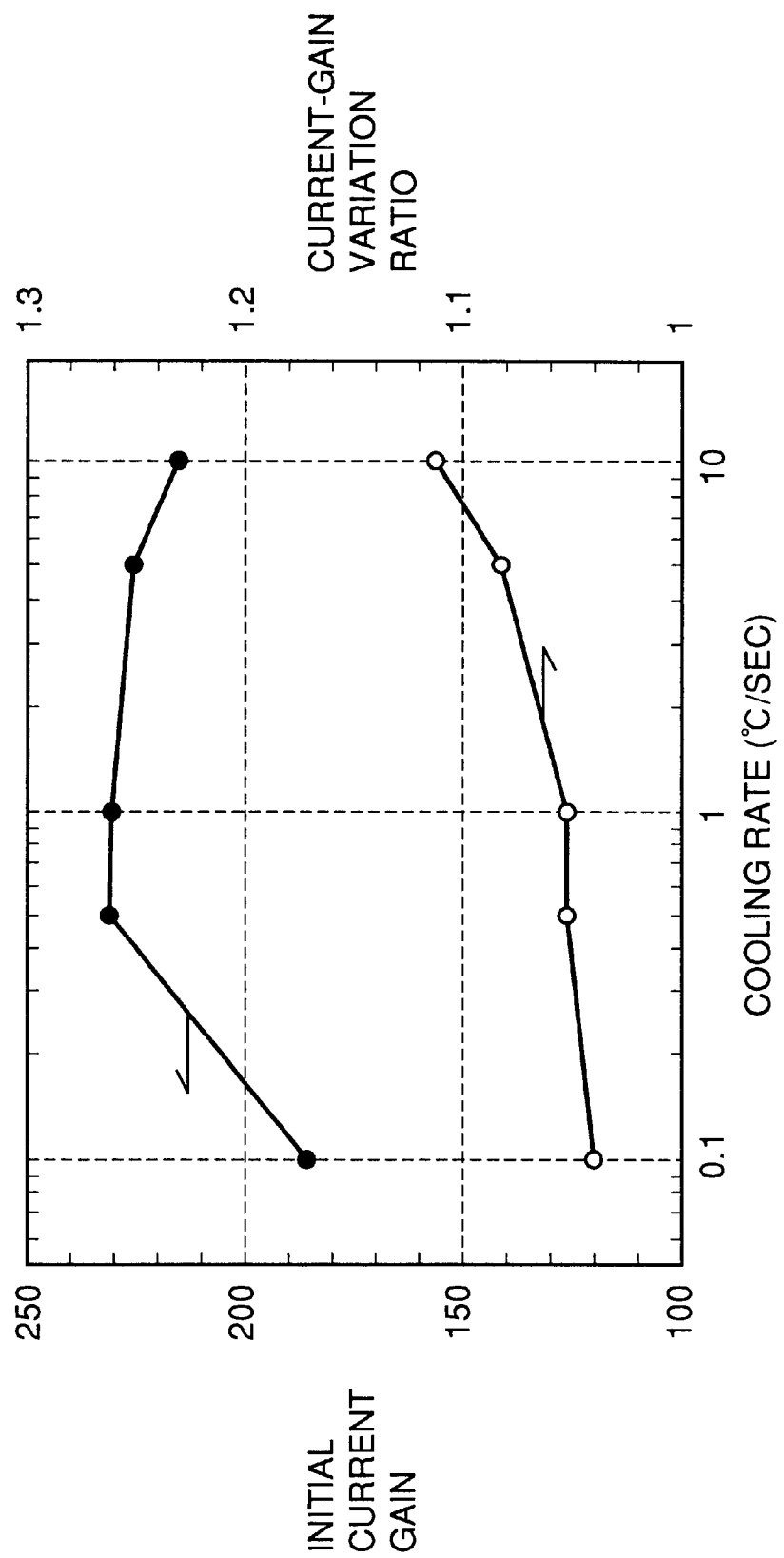
FIG. 4 is a graph of initial HBT current gain and HBT current-gain variation ratio versus cooling rate of thermal annealing in a third embodiment of the present invention.

In a third embodiment was examined how various cooling rates after thermal annealing affect initial HBT current gain and HBT current-gain variation ratio. Specifically, in the third embodiment the FIG. 8 wafers prepared according to a conventional technique were subjected to thermal annealing at 550° C. for 30 minutes and then cooled at various cooling rates. The cooling rates were 0.1° C./sec, 0.5° C./sec, 1° C./sec, 5° C./sec and 10° C./sec. Wafers subjected to such thermal annealing were used to fabricate HBTs. FIG. 4 represents properties of the HBTs.

The FIG. 4 graph is similar to the FIG. 3 graph, though the former differs from latter in that the horizontal axis represents cooling rate (in ° C./sec). As is apparent from white dots in the graph, HBT current-gain variation ratio reduces as cooling rate is decreased from 10° C./sec to 0.1° C./sec. In a cooling-rate range of 0.1° C./sec to 5° C./sec, HBT current-gain variation ratio is preferably no more than 1.1. Furthermore, in a cooling-rate range of 0.1° C./sec to 1° C./sec, current-gain variation ratio is most preferably no more than 1.05. Also, as is apparent in FIG. 4 from black dots, initial HBT current gain is most preferably increased in a cooling-rate range of 0.5° C./sec to 1° C./sec.

Fourth Embodiment

In a fourth embodiment, a method similar to the conventional technique was employed to prepare a semiconductor wafer having a layered structure similar to that shown in FIG. 8. More specifically, the manufacturing method of the fourth embodiment differs from the conventional manufacturing method only in that base layer 4 is subjected to thermal annealing at 600° C. for 15 minutes after emitter layer 5 is deposited. A wafer subjected to such thermal annealing in the course of depositing multiple semiconductor layers over base layer 4, was used to fabricate an HBT. The HBT had an initial current gain of 220 and a current-gain variation ratio of 1.05. In other words, the HBT of the fourth embodiment can be preferably used as a high current transistor for mobile communication.

Fifth Embodiment

According to an HBT manufacturing method of a fifth embodiment, base layer 4 was subjected to thermal annealing multiple times. More specifically, the manufacturing method of the fifth embodiment is similar to the conventional method of preparing the FIG. 8 wafer, though the former differs from the latter only in that thermal annealing was applied twice, i.e., immediately after emitter layer 5 was deposited and immediately after emitter contact layer 6 was deposited. The two thermal annealings were both applied at 600° C. for five minutes.

The wafer thus treated in the fifth embodiment was used to fabricate an HBT. The HBT had an initial current gain of 230 and a current-gain variation ratio of 1.00. In other words, as compared to the fourth embodiment with thermal annealing applied only once, the fifth embodiment with thermal annealing applied twice can reduce thermal annealing time in total and also further reduce current-gain variation ratio.

Sixth Embodiment

The manufacturing method of a sixth embodiment is also similar to the conventional manufacturing method, preparing a semiconductor wafer having a structure similar to the FIG. 8 layered structure, though the former method differs from the latter method only in that thermal annealing was applied twice, i.e., immediately after base layer 4 was deposited and immediately after emitter layer 5 and emitter contact layer 6 were deposited. A thermal annealing immediately after the deposition of base layer 4 was applied at 600° C. for five minutes. The thermal annealing after the deposition of emitter layer 5 and emitter contact layer 6 was applied at 600° C. for 15 minutes.

The wafer thus treated in the sixth embodiment was used to fabricate an HBT. The HBT had an initial current gain of 190 and a current-gain variation ratio of 1.05. In other words, it can be understood that the HBT obtained in accordance with the manufacturing method of the sixth embodiment can also be preferably used as a high current transistor for mobile communication.

Furthermore, the HBT fabricated in the sixth embodiment had a hole carrier concentration of $2.5 \times 10^{19}/cm^3$ in its base layer, whereas the HBT fabricated using a wafer subjected to thermal annealing at 600° C. for 15 minutes in the first embodiment had a hole carrier concentration of $2.2 \times 10^{19}/cm^3$ in its base layer. In other words, it can be understood the thermal annealing in the sixth embodiment can increase the hole carrier concentration in an HBT base layer. This may be because the thermal annealing immediately after the deposition of base layer 4 effectively removed hydrogen so that carbon as a dopant was more activated to increase hole carrier concentration.

Seventh Embodiment

A manufacturing method of a seventh embodiment is also similar to the conventional manufacturing method, preparing a semiconductor wafer having a layered structure similar to that shown in FIG. 8, though the former method differs from the latter method only in that thermal annealing was applied twice, i.e., immediately after base layer 4 was deposited and immediately after emitter layer 5 was deposited. The thermal annealing immediately after the deposition of base layer 4 was applied at 600° C. for five minutes, and the thermal annealing immediately after the deposition of emitter layer 5 was applied at 600° C. for 15 minutes.

The wafer thus treated in the seventh embodiment was used to fabricate an HBT. The HBT had an initial current gain of 190 and a current-gain variation ratio of 1.05. That is, the HBT of the seventh embodiment can also be preferably used as a high current transistor for mobile communication. The HBT's base layer of the seventh embodiment had as high a hole carrier concentration as that of the sixth embodiment, i.e., $2.5 \times 10^{19}/cm^3$.

Eighth Embodiment

Figure 9:
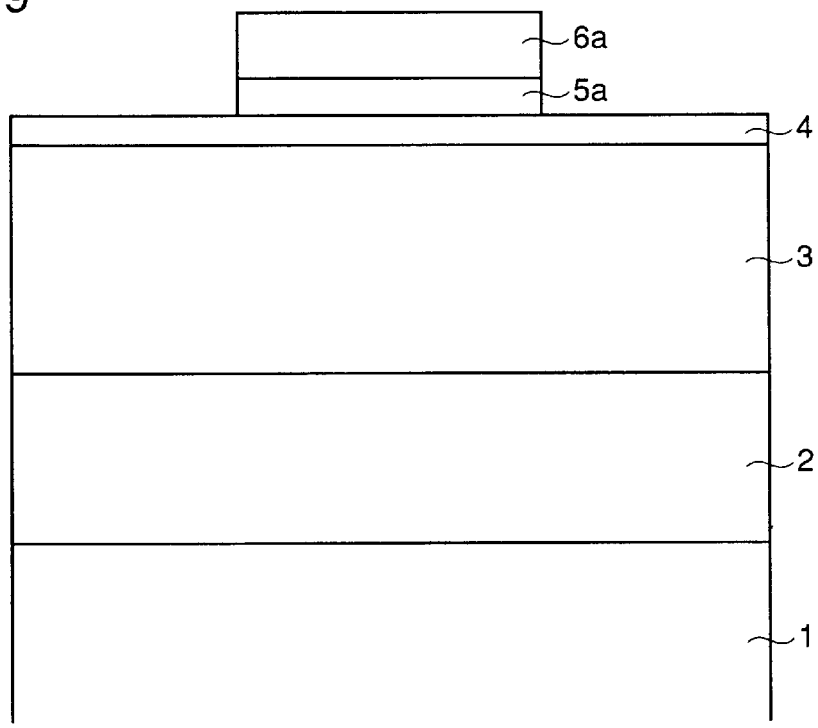
FIG. 9 is a schematic cross section of a semiconductor wafer having an emitter mesa structure used in fabricating an HBT in the eighth embodiment of the present invention.

In an eighth embodiment, the conventional manufacturing method was employed to prepare the FIG. 8 semiconductor wafer, and emitter layer 5 and an emitter contact layer 6 were then processed to form an emitter mesa 5a and an emitter contact mesa 6a, as shown in FIG. 9. The FIG. 9 wafer was subjected to thermal annealing at 600° C. for 15 minutes.

The wafer subjected to such thermal annealing in the eighth embodiment was used to fabricate an HBT. The HBT had an initial current gain of 170 and a current-gain variation ratio of 1.05. It can also be understood that the HBT of the eighth embodiment has further been improved than those of the sixth and seventh embodiments, having a hole carrier concentration of $2.7 \times 10^{19}/cm^3$ in its base layer. This may be because the relatively long, 15-minute thermal annealing on an external region of the base layer having an exposed surface effectively removes hydrogen from base layer 4 so that carbon as a dopant is more activated to increase hole carrier concentration. The prevention of significant drop in current gain may be attributed to prevention of desorption of arsenic from an interface between emitter mesa 5a and an intrinsic base layer region exactly under the emitter mesa 5a region.

Ninth Embodiment

In a ninth embodiment was examined how total thickness of one or more semiconductor layers formed over a carbon-doped base layer affects effectiveness of thermal annealing.

Initially, the FIG. 8 wafer prepared using the conventional technique was subjected to thermal annealing at 550° C. for 30 minutes. This wafer was used to fabricate an HBT1. More specifically, HBT1 had emitter layer 5 and emitter contact layer 6 of 100 nm and 200 nm, respectively, in thickness.

Figure 10:
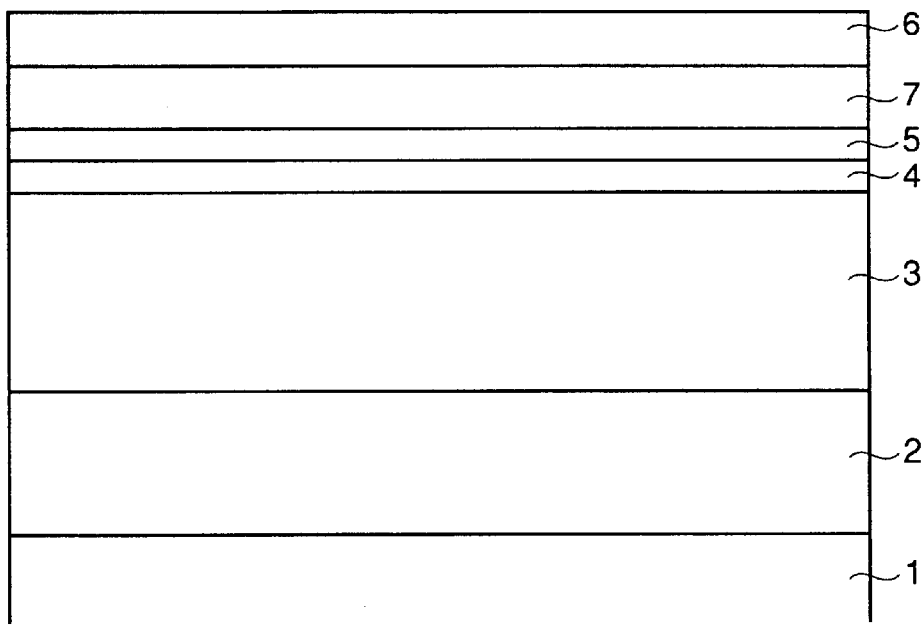
FIG. 10 is a schematic cross section of a semiconductor wafer for an HBT in the ninth embodiment.

Then a wafer with a layered structure shown in FIG. 10 was subjected to thermal annealing. The layered structure of FIG. 10 is similar to that of the FIG. 8, though the former differs from the latter only in that one of n-type $Al_{0.35}Ga_{0.65}As$ ballast layers 7 varied in thickness and having an electron carrier concentration of $5 \times 10^{16}/cm^3$ is inserted between emitter layer 5 and emitter contact layer 6 and that emitter layer 5 and emitter contact layer 6 are varied in thickness. Such wafers as shown in FIG. 10 were subjected to thermal annealing at 550° C. for 30 minutes and then used to fabricate HBT2 to HBT6.

HBT2 had emitter layer 5, ballast layer 7 and emitter contact layer 6 of 100 nm, 200 nm and 200 nm, respectively, in thickness.

HBT3 had emitter layer 5, ballast layer 7 and emitter contact layer 6 of 250 nm, 300 nm and 450 nm, respectively, in thickness.

HBT4 had emitter layer 5, ballast layer 7 and emitter contact layer 6 of 250 nm, 400 nm and 500 nm, respectively, in thickness.

HBT5 had emitter layer 5, ballast layer 7 and emitter contact layer 6 of 250 nm, 500 nm and 200 nm, respectively, in thickness.

HBT6 had emitter layer 5, ballast layer 7 and emitter contact layer 6 of 100 nm, 400 nm and 200 nm, respectively, in thickness.

Figure 5:
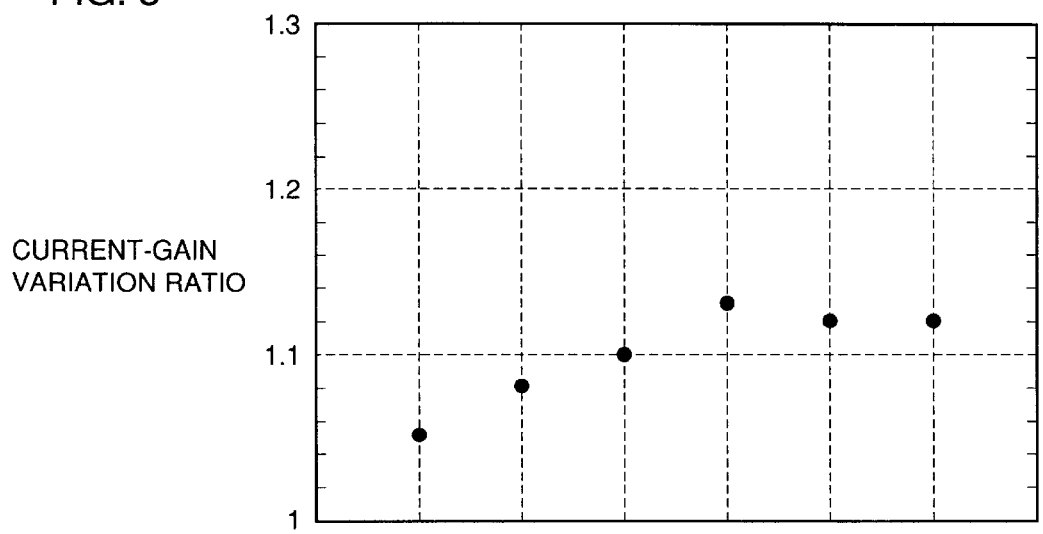
FIG. 5 is a graph of current-gain variation ratio versus thickness of various semiconductor layers over a base layer that are included in each of HBTs in a ninth embodiment of the present invention.

FIG. 5 represents current-gain variation ratio for each of HBT1 to HBT6. More specifically, in the FIG. 5 graph the horizontal axis corresponds to varied thickness of various semiconductor layers and the vertical axis represents HBT current-gain variation ratio. As is apparent from FIG. 5, the HBT current-gain variation ratio of no more than 1.1 cannot be achieved unless emitter layer 5, ballast layer 7 and emitter contact layer 6 have a thickness of no more than 1 µm in total.

It can also be understood that the HBT current-gain variation ratio of no more than 1.1 can also not be achieved when emitter layer 5 and ballast layer 7 have a thickness exceeding 550 nm in total. It can also be understood that the HBT current-gain variation ratio of no more than 1.1 can also not be achieved unless ballast layer 7 has a thickness of no more than 300 nm.

Tenth Embodiment

Figure 11:
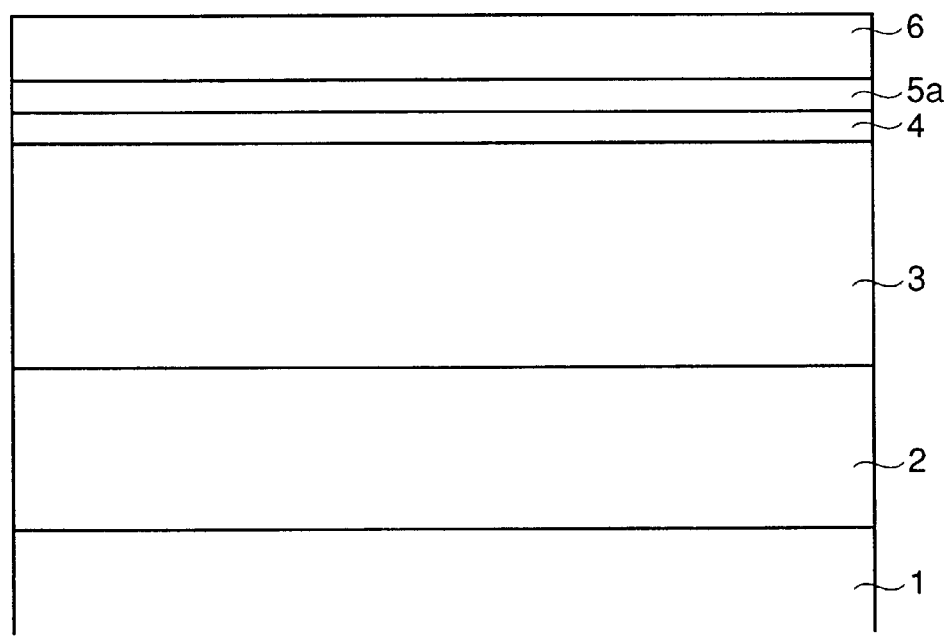
FIG. 11 is a schematic cross section of a semiconductor wafer for an HBT in a tenth embodiment of the present invention.

In a tenth embodiment, a wafer with a layered structure shown in FIG. 11 was used to fabricate an HBT. The FIG. 11 wafer is similar to the FIG. 8 wafer, though the former differs from the latter only in the provision of an n-type $In_{0.5}Ga_{0.5}P$ emitter layer 5a of 0.1 µm thickness with an electron carrier concentration of $5 \times 10^{17}/cm^3$. Emitter layer 5a of the present embodiment as well as emitter layer 5 of FIG. 8 was also grown at 590° C.

The FIG. 11 wafer was subjected to thermal annealing in an ambient of nitrogen at 550° C. for 30 minutes. An HBT fabricated using the wafer of the tenth embodiment, had a current gain of 230 and a current-gain variation ratio of 1.01.

In other words, it can be understood that in the tenth embodiment a phosphorus-containing compound semiconductor used as emitter layer 5a can particularly effectively reduce current-gain variation ratio. This may be because InGaP emitter layer 5a can serve as a barrier against the diffusion of As of base layer 4 to reduce As vacancies in base layer 4.

It should be noted that as a material for emitter layer 5a, InAlP, InGaAlP, InGaAsP, InAlAsP or InGaAlAsP may be as effective as InGaP used in the tenth embodiment.

Eleventh Embodiment

Figure 12:
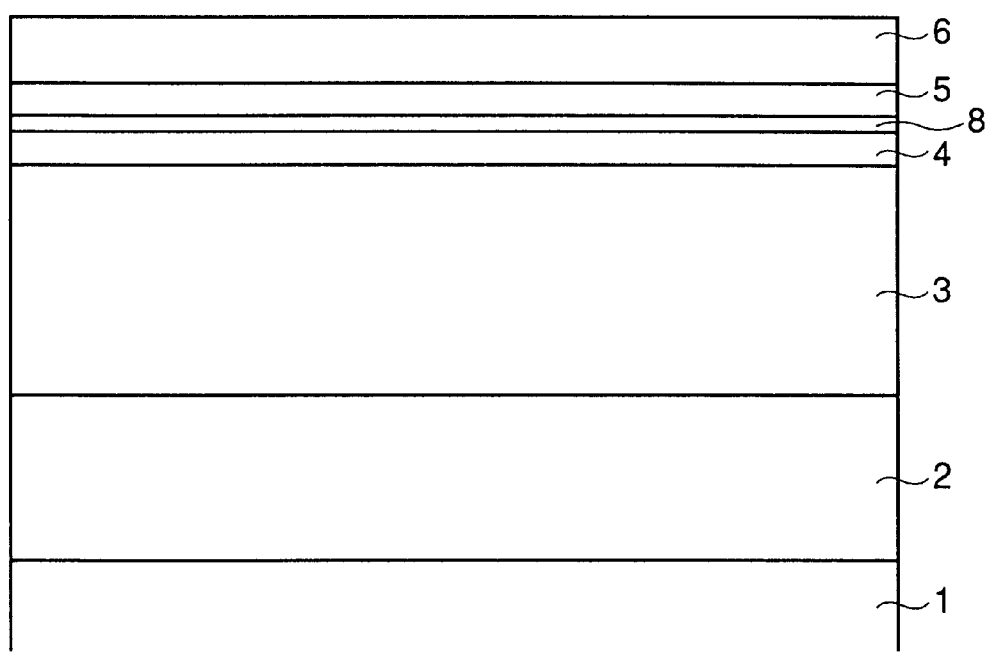
FIG. 12 is a schematic cross section of a semiconductor wafer for an HBT in an eleventh embodiment of the present invention.

In a eleventh embodiment was employed a wafer with an etching stopper layer 8 of a phosphorus-containing compound semiconductor inserted between base layer 4 and emitter layer 5, as shown in FIG. 12. More specifically, the FIG. 12 wafer is similar to the FIG. 8 wafer, though the former differs from the latter only in that n-type $In_{0.5}Ga_{0.5}P$ etching stopper layer 8 of 0.02 µm thickness with an electron carrier concentration of $5 \times 10^{17}/cm^3$ is inserted between base layer 4 and emitter layer 5. Etching stopper layer 8, as well as emitter layer 5 and emitter contact layer 6, was grown at 590° C. It should be noted that etching stopper layer 8 is provided to prevent base layer 4 from being etched when emitter layer 5 and emitter contact layer 6 are etched into a mesa structure.

The FIG. 12 wafer was subjected to thermal annealing in an ambient of nitrogen at 550° C. for 30 minutes. An HBT fabricated using the wafer subjected to such thermal annealing had an initial current gain of 240 and a current-gain variation ratio of 1.01. In other words, it can be understood that the HBT according to the manufacturing method of the eleventh embodiment with a phosphorus-containing compound semiconductor used as etching stopper layer 8, as well as the HBT of the tenth embodiment, can provide a significantly reduced current-gain variation ratio.

It should be noted that as a material for etching stopper layer 8, InAlP, InGaAlP, InGaAsP, InAlAsP, or InGaAlAsP can be expected to be as effective as that used in the eleventh embodiment.

Twelfth Embodiment

In a twelfth embodiment was examined how a passivation film covering a semiconductor wafer being subjected to thermal annealing affects properties of an HBT.

Initially, the conventional manufacturing method was employed to prepare three wafers having the FIG. 8 structure. Of the three wafers, a first wafer was not provided with any passivation film. A second wafer had a $SiO_2$ passivation film of 200 nm thickness deposited thereon. A third wafer had a $SiN_X$ passivation film of 200 nm thickness deposited thereon.

The first to third wafers were all subjected to thermal annealing at 600° C. for 15 minutes. Then the $SiO_2$ and $SiN_X$ passivation films were etched away and the wafers thus prepared were used to fabricate HBTs. The three HBTs thus obtained all had a current-gain variation ratio of 1.05.

Figure 6:
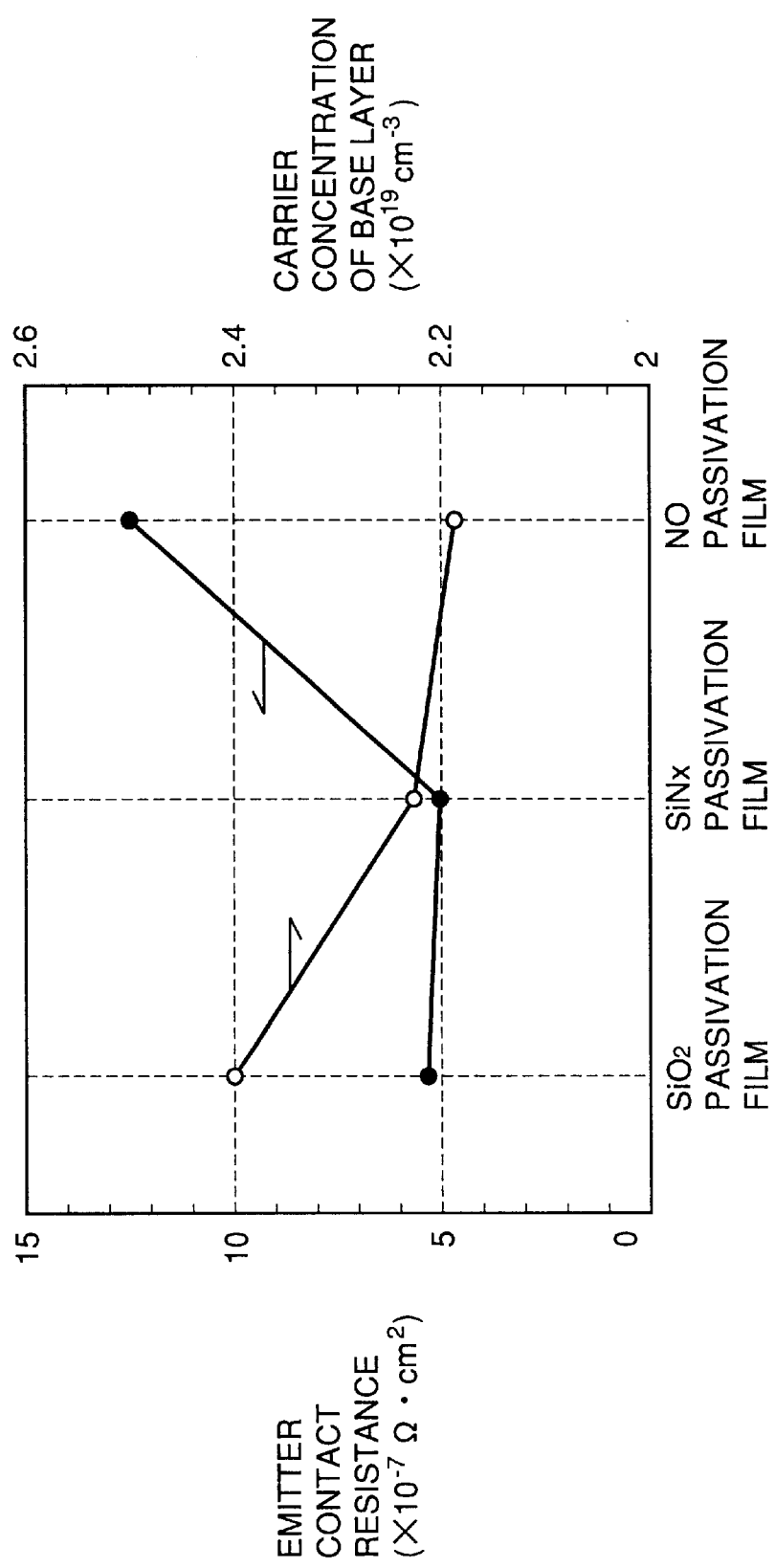
FIG. 6 represents HBT emitter contact resistance and base layer's hole carrier concentration influenced by various passivation films covering semiconductor wafers in thermal annealing in a twelfth embodiment of the present invention.

FIG. 6 represents properties of the HBTs obtained using the first to third wafers. More specifically, in the FIG. 6 graph, the horizontal axis corresponds to the types of passivation films applied to the first to third wafers, and the left vertical axis represents HBT emitter contact resistance (multiplied by $10^{-7}$ $\Omega \cdot cm^2$) and the right vertical axis represents hole carrier concentration (multiplied by $10^{19}/cm^3$) of HBT base layer. On the graph, the black dots represent emitter contact resistance and the white dots represent base carrier concentration.

As is apparent from FIG. 6, the HBTs each with a passivation film applied thereto during thermal annealing is significantly lower in emitter contact resistance than the HBT without a passivation film applied thereto during thermal annealing. This may be because the passivation films prevent desorption of arsenic from emitter contact layer 6 during thermal annealing. As is also apparent from FIG. 6, the application of the $SiO_2$ passivation film during thermal annealing results in a higher hole carrier concentration in base layer 4 than the application of the $SiN_X$ passivation film during thermal annealing. This may be because the $SiO_2$ film allows hydrogen to be efficiently desorbed from base layer 4, since $SiO_2$ film is more transmissive than $SiN_X$ film with respect to hydrogen while preventing desorption of arsenic from emitter contact layer 6.

Thirteenth Embodiment

In a thirteenth embodiment, an emitter mesa and an emitter contact mesa were formed in a semiconductor wafer and a passivation film was then applied thereto before the wafer was subjected to thermal annealing.

Initially, the manufacturing method according to the conventional technique was employed to prepare two semiconductor wafers having the FIG. 8 structure. The two semiconductor wafers were both etched to have emitter mesa 5a and emitter contact mesa 6a shown in FIG. 9. A $SiO_2$ passivation film of 200 nm thickness was deposited on one of the two wafers such as shown in FIG. 9, and a $SiN_X$ passivation film of 200 nm thickness was deposited on the other wafer. The two wafers were subjected to thermal annealing at 600° C. for 15 minutes.

The two wafers thus subjected to such thermal annealing were used to fabricate HBTs. The HBTs both had a current-gain variation ratio of 1.05. The HBT with the $SiO_2$ passivation film applied thereto and that with the $SiN_X$ passivation film applied thereto had hole carrier concentrations of $3.0 \times 10^{19}/cm^3$ and $2.7 \times 10^{19}/cm^3$, respectively, in base layer 4. In other words, in the thirteenth embodiment also, the application of a $SiO_2$ passivation film results in a higher hole carrier concentration in base layer 4 than that of a $SiN_X$ passivation film and either passivation film in the present embodiment provides a higher carrier concentration within base layer 4 than that in the twelfth embodiment. This may be because hydrogen is desorbed from base layer 4 more efficiently in the thirteenth embodiment than in the twelfth embodiment.

Fourteenth Embodiment

In a fourteenth embodiment was examined how MOCVD conditions for base layer 4 affect HBT current-gain variation ratio.

Initially, the manufacturing method according to the conventional technique was employed to prepare the FIG. 8 wafer as a wafer provided under a first MOCVD condition. More specifically, the first MOCVD growth condition for base layer 4 required a temperature of 590° C., a V/III ratio of 3.5 using TMAs and TMGa, and a TMGa flow rate of 1.5 sccm. A second MOCVD condition for base 4 required a temperature of 630° C., a V/III ratio of 2.0 using TMAs and TMGa, and a TMGa flow rate of 5.0 sccm. Under the first MOCVD condition, the first wafer's base 4 was grown by a method in which the epitaxial growth mode was the reaction rate limited of the group-III precursor. Under the second MOCVD condition, base layer 4 was grown by a method in which the epitaxial growth mode was the flow rate limited of the group-III precursor.

It should be noted that the reaction rate limited mode means a mode in which at relatively low temperatures the precursor is insufficiently pyrolyzed and only partially contributes to the growth of base layer 4. In this case, the growth rate of base layer 4 decreases in proportion to a reciprocal of temperature. The flow rate limited mode means a mode in which at relatively high temperatures the precursor is sufficiently pyrolyzed and all contributes to the growth of base layer 4. In this case, the growth rate of base layer 4 is a constant rate determined by the flow rate of the precursor and it does not depend on temperature.

Figure 7:
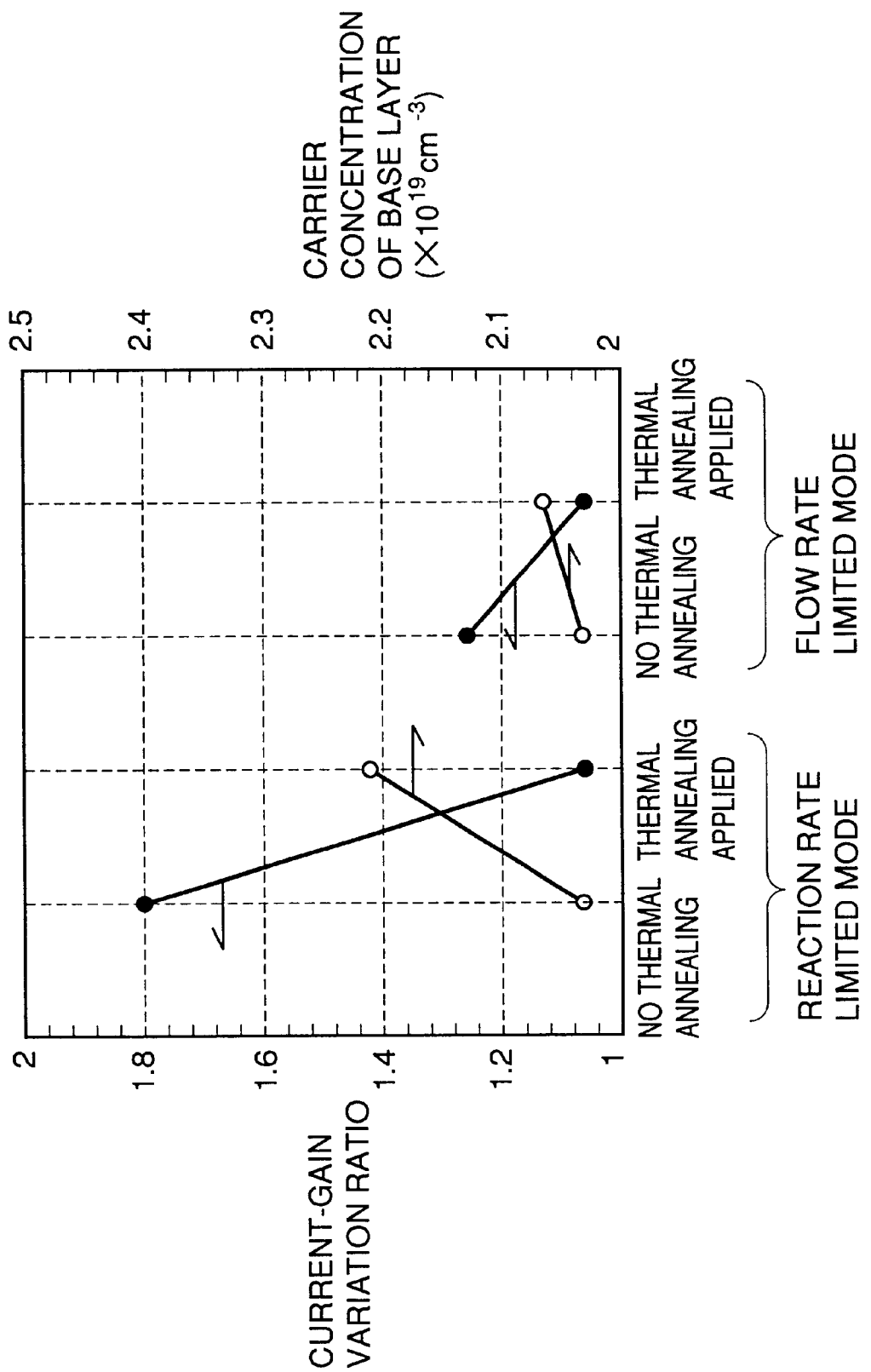
FIG. 7 represents HBT current-gain variation ratio and base layer's carrier concentration under various MOCVD conditions for the base layer in a fourteenth embodiment of the present invention.

The wafers obtained under the first and second MOCVD conditions were both subjected to thermal annealing at 550° C. for 30 minutes. FIG. 7 represents properties of HBTs fabricated using such wafers.

In the FIG. 7 graph, the horizontal axis corresponds HBT fabricating condition, and the left vertical axis represents HBT current-gain variation ratio and the right vertical axis represents carrier concentration in HBT base layer. As is apparent from the black dots in the graph, HBTs, whether their base layers are deposited in the reaction-dependent rate-determining state or the supply-dependent rate-determining state can each have a reduced current-gain variation ratio when their wafers are subjected to thermal annealing. It can also be understood in the FIG. 7 graph from the white dots that the HBT with its base layer formed in the reaction rate limited mode means a mode attains a more significant rise in the base layer's hole carrier concentration when thermal annealing is applied than the HBT with its base layer formed in the flow rate limited mode means a mode.

It has also been found as a result of further detailed examination that a temperature of no more than 620° C. and a V/III ratio of no less than 2.5 allow a base layer to grow in the reaction rate limited mode means a mode of the group-III material and to have its hole carrier concentration increased through thermal annealing. This may be because a base layer grown in the reaction rate limited mode means a mode takes more hydrogen thereinto so that thermal annealing is more remarkably effective.

It should be noted that while TMGa and TMAs are used in the first to fourteenth embodiments, the group-III precursor may be triethylgallium (TEGa), trimethylaluminum (TMAl), triethylaluminum (TEAM), trimethylindium (TMIn) or triethylindium (TEIn), the group-V precursor may be arsine ($AsH_3$), triethylarsenic (TEAs), tertiary butyl arsine (TBAs), phosphine ($PH_3$) or tertiary butyl phosphine (TBP), and the carbon material may be carbon tetrabromide ($CBr_4$) or diiodemethane ($CH_2I_2$).

Fifteenth Embodiment

In a fifteenth embodiment, an HBT fabricated from a wafer subjected to thermal annealing at 550° C. for 30 minutes in the first embodiment was used in a power amplifier used for a high frequency signal of 1.5 GHz. The HBT had an emitter of 6×80 μm in size. When an output of 32 dBm was generated under a linear amplification condition required for a W-CDMA terminal, a conventional HBT experienced a rise in current gain just after it started to operate. Furthermore, when the conventional HBT continued to operate, it presented thermally unstable performance, and decreased in current gain as its temperature rose. By contrast, the HBT of the first embodiment that was used in the power amplifier remained stable in current gain from the initiation of its operation onwards and the HBT did not experience thermal variations in its properties when it continued to operate. That is, it can be understood that the HBT manufacturing method of the present invention is effective for an HBT which generates more heat when it operates in a power amplifier for very high frequencies.

As described above, the present invention can provide an HBT having a current-gain variation ratio of no more than 1.10 to operate a circuit as designed for a very high frequency signal. Such HBT can be preferably used in a power amplifier for mobile communication.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a hetero-junction bipolar transistor including a carbon-doped base layer, comprising the steps of:
   (a) growing said base layer on an underlying layer through chemical vapor deposition;
   (b) forming at least one semiconductor layer over said base layer; and
   (c) subjecting said underlying layer, said base layer and said at least one semiconductor layer to thermal annealing for 15 minutes to 1 hour at a range of 520° C. to 650° C., and the thermal annealing is at a heating rate of 1 to 100° C./second.

2. The method of claim 1, wherein also between the steps (a) and (b) said base layer is subjected to thermal annealing in the same temperature range as that in the step (c).

3. The method of claim 1, wherein in the step (b) an emitter mesa is formed on said base layer.

4. The method of claim 1, only a single semiconductor layer is formed in the step (b), and the step (b) of forming only a single semiconductor layer and the step (c) are repeated multiple times.

5. The method of claim 1, wherein in the step (c) said underlying layer, said base layer and said at least one semiconductor layer are subjected to thermal annealing at a heating rate of 1 to 100° C./second and a cooling rate of 0.1 to 10° C./second.

6. The method of claim 1, wherein said base layer contains a III–V group compound semiconductor selected from the group consisting of GaAs, AlGaAs and InGaAs.

7. The method of claim 6, wherein said base layer is grown in a process depending on a reaction rate of a precursor for a group-III element.

8. The method of claim 6, wherein said base layer is grown at a temperature of at most 620° C. and a flow-rate ratio of at least 2.5, said flow-rate ratio being a ratio of a flow rate of a precursor for a group-V element to that of a precursor for a group-III element.

9. The method of claim 1, wherein said base layer has a hole carrier concentration of at least $1.5 \times 10^{19}/cm^3$.

10. The method of claim 1, wherein an emitter layer containing a compound semiconductor selected from the group consisting of InGaP, InAlP, InGaAlP, InGaAsP, InAlAsP and InGaAlAsP is formed in the step (b).

11. The method of claim 1, wherein the at least one semiconductor layer formed on said base layer in the step (b) has a total thickness of no more than 1 μm.

12. The method of claim 1, wherein the semiconductor layers formed on said base layer in the step (b) includes emitter and ballast layers having a total thickness of no more than 550 nm.

13. The method of claim 12, wherein said ballast layer has a thickness of no more than 300 nm.

14. The method of claim 1, wherein the at least one semiconductor layer formed on said base layer in the step (b) has an outermost surface covered by a $SiO_2$ passivation film before said base layer is subjected to thermal annealing in the step (c).

15. The method of claim 1, wherein the heating rate is 1 to 50° C./second.

16. The method of claim 1, wherein the heating rate is 1 to 10° C./second.

17. The method of claim 1, wherein a current-gain variation ratio is not more than 1.1.

18. A method of manufacturing a hetero-junction bipolar transistor including a carbon-doped base layer, comprising the steps of:
   (a) growing said base layer on an underlying layer through chemical vapor deposition;
   (b) forming at least one semiconductor layer over said base layer;
   (c) subjecting said underlying layer, said base layer and said at least one semiconductor layer to thermal annealing for 15 minutes to 1 hour at a range of 520° C. to 650° C.; and
   (d) cooling at a cooling rate of 0.1 to 10° C./second.

19. The method of claim 18, wherein the cooling rate is 0.1 to 5° C./second.

20. The method of claim 18, wherein the cooling rate is 0.1 to 1° C./second.

21. The method of claim 18, wherein a current-gain variation ratio is not more than 1.1.

* * * * *